United States Patent
Chudzik et al.

(10) Patent No.: US 11,837,683 B2
(45) Date of Patent: Dec. 5, 2023

(54) INDIUM-GALLIUM-NITRIDE LIGHT EMITTING DIODES WITH INCREASED RED-LIGHT QUANTUM EFFICIENCY

(71) Applicant: Applied Materials, Inc., Santa Clara, CA (US)

(72) Inventors: Michael Chudzik, Mountain View, CA (US); Michel Khoury, Santa Barbara, CA (US); Max Batres, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 441 days.

(21) Appl. No.: 17/197,493

(22) Filed: Mar. 10, 2021

(65) Prior Publication Data
US 2022/0293821 A1 Sep. 15, 2022

(51) Int. Cl.
*H01L 33/32* (2010.01)
*H01L 33/16* (2010.01)
(Continued)

(52) U.S. Cl.
CPC ............ *H01L 33/32* (2013.01); *H01L 33/007* (2013.01); *H01L 33/0093* (2020.05);
(Continued)

(58) Field of Classification Search
CPC ..... H01L 27/15; H01L 27/153; H01L 33/007; H01L 33/08; H01L 33/10; H01L 33/16;
(Continued)

(56) References Cited

U.S. PATENT DOCUMENTS

| 2015/0041822 A1 | 2/2015 | Hwang et al. | |
| 2022/0259766 A1* | 8/2022 | Chudzik | ........... H01L 21/02513 |
| 2022/0285584 A1* | 9/2022 | Khoury | ............... H01L 33/0093 |

FOREIGN PATENT DOCUMENTS

| KR | 20120108838 A | 10/2012 |
| KR | 20130055976 A | 5/2013 |

(Continued)

OTHER PUBLICATIONS

Application No. PCT/US2022/017897, International Search Report and Written Opinion, dated Jun. 16, 2022, 10 pages.

*Primary Examiner* — Robert G Bachner
*Assistant Examiner* — Molly K Reida
(74) *Attorney, Agent, or Firm* — Kilpatrick Townsend & Stockton LLP

(57) ABSTRACT

Exemplary processing methods of forming a semiconductor structure may include forming a nucleation layer on a semiconductor substrate. The methods may further include forming first, second, and third, gallium-and-nitrogen-containing regions on the nucleation layer. The first gallium-and-nitrogen-containing region may be porosified, without porosifying the second and third gallium-and-nitrogen containing regions. The methods may still further include forming a first active region on the porosified first gallium-and-nitrogen-containing region, and a second active region on the unporosified second gallium-and-nitrogen-containing region. The methods may yet also include forming a third active region on the unporosified third gallium-and-nitrogen-containing region.

20 Claims, 6 Drawing Sheets

(51) Int. Cl.
  *H01L 33/08* (2010.01)
  *H01L 33/10* (2010.01)
  *H01L 33/18* (2010.01)
  *H01L 33/00* (2010.01)
(52) U.S. Cl.
  CPC .............. *H01L 33/08* (2013.01); *H01L 33/10* (2013.01); *H01L 33/16* (2013.01); *H01L 33/18* (2013.01)
(58) Field of Classification Search
  CPC ...... H01L 33/18; H10K 59/35; H10K 59/351; H10K 59/80518
  See application file for complete search history.

(56) References Cited

FOREIGN PATENT DOCUMENTS

| | | |
|---|---|---|
| KR | 20170116881 A | 10/2017 |
| WO | 2019079381 A1 | 4/2019 |

* cited by examiner

INDIUM-GALLIUM-NITRIDE LIGHT EMITTING DIODES WITH INCREASED RED-LIGHT QUANTUM EFFICIENCY

TECHNICAL FIELD

The present technology relates to semiconductor processes and products. More specifically, the present technology relates to producing semiconductor structures and the devices formed.

BACKGROUND

Integrated circuits are made possible by processes which produce intricately patterned material layers on substrate surfaces. Producing patterned material on a substrate requires controlled methods for deposition and removal of materials. However, with new device designs, producing high quality layers of material may be challenging.

Thus, there is a need for improved systems and methods that can be used to produce high quality devices and structures. These and other needs are addressed by the present technology.

SUMMARY

The present technology includes exemplary semiconductor processing methods that may include forming a nucleation layer on a semiconductor substrate. The methods may further include forming first, second, and third, gallium-and-nitrogen-containing regions on the nucleation layer. The first gallium-and-nitrogen-containing region may be porosified, without porosifying the second and third gallium-and-nitrogen containing regions. The methods may still further include forming a first active region on the porosified first gallium-and-nitrogen-containing region, and a second active region on the unporosified second gallium-and-nitrogen-containing region. The methods may yet also include forming a third active region on the unporosified third gallium-and-nitrogen-containing region.

In additional embodiments, the first active region and the second active region may be formed in a single deposition of an active region material on the semiconductor substrate. In still further embodiments, the active region material may include an InGaN-containing material. In more embodiments, the forming of the third active region may include forming one or more v-pits in the third active region. In still more embodiments, the first active region may be characterized by a first peak light emission wavelength that is between a second peak light emission wavelength that characterizes the second active region and a third peak light emission wavelength that characterizes the third active region. In embodiments, the second peak light emission wavelength is less than or about 550 nm, and the third peak light emission wavelength is greater than or about 600 nm. In still additional embodiments, the methods may include forming a first reflection layer on the first, second, and third active regions, followed by removing a portion of the first reflection layer from the third active region. In embodiments, a second reflection layer may be formed over the first, second, and third active regions. In further embodiments, the first reflection layer may include aluminum, and the second reflection layer may include copper.

The present technology also includes additional semiconductor processing methods that may include forming first, second, and third gallium-and-nitrogen-containing regions. The methods may further include depositing an active region material on the first and second gallium-and-nitrogen-containing regions, where the active region material is formed into a first active region on the first gallium-and-nitrogen-containing region, and a second active region on the second gallium-and-nitrogen-containing region. The methods my still further include forming a third active region on the third gallium-and-nitrogen-containing region. The methods may also include forming a first reflection layer on the first, second, and third active regions, and removing a portion of the first reflection layer from the third active region. The methods may still further include forming a second reflection layer over the first, second, and third active regions.

In additional embodiments, the methods may further include forming a transparent conductive layer on the first, second, and third active regions before forming the first reflection layer on the first, second, and third active regions. In embodiments, the transparent conductive layer may include indium-tin-oxide. In still further embodiments, the first reflection layer may include aluminum, and the second reflection layer may include copper. In further embodiments, the methods may include porosifying the first gallium-and-nitrogen-containing region without porosifying the second and third gallium-and-nitrogen-containing regions. In yet further embodiments, the forming of the third active region may include forming v-pits in the third active region. In embodiments, the first active region may be characterized by a first peak light emission wavelength that is between a second peak light emission wavelength that characterizes the second active region and a third peak light emission wavelength that characterizes the third active region. In embodiments, the second peak light emission wavelength is less than or about 550 nm, and the third peak light emission wavelength is greater than or about 600 nm.

The present technology further includes semiconductor structures that may include a first InGaN-containing active region on a porosified first gallium-and-nitrogen-containing region. The semiconductor structures may also include a second InGaN-containing active region on an unporosified second gallium-and-nitrogen-containing region. The semiconductor structures may still further include a third InGaN-containing active region on an unporosified third gallium-and-nitrogen-containing layer. In embodiments, the first active region may be characterized by a first peak light emission wavelength between a second peak light emission wavelength that characterizes the second active region and a third peak light emission wavelength that characterizes the third active region. In further embodiments, the second peak light emission wavelength may be less than or about 550 nm, and the third peak light emission wavelength may be greater than or about 600 nm.

In additional embodiments, the first, second, and third gallium-and-nitrogen-containing regions of the semiconductor structure may contact a nucleation layer that includes at least one of gallium nitride, aluminum-gallium-nitride, indium-gallium-nitride, aluminum nitride, niobium nitride, titanium nitride, or hafnium nitride. In further embodiments, the first InGaN-containing active region and the second InGaN-containing active region are formed from a single deposition of an InGaN-containing material. In more embodiments, the third InGaN-containing active region may include one or more v-pits. In yet more embodiments, the semiconductor structure may further include an aluminum-containing first reflection layer on the first and second active regions, and a copper-containing second reflection layer on the third active region. In still further embodiments, the semiconductor structure may include a transparent conductive layer positioned between the active regions and the reflection layers.

Such technology may provide numerous benefits over conventional semiconductor processing methods and structures. For example, embodiments of the processing methods reduce the number of operations to form active regions with different peak light emission wavelengths by performing a single deposition of active region material on two or more gallium-and-nitrogen-containing regions characterized by different amounts of porosity. In embodiments, the active region material deposited on a less porous gallium-and-nitrogen-containing region forms an active region characterized by a shorter peak light emission wavelength than the same active region material deposited on a more porous gallium-and-nitrogen-containing material. In further examples, embodiments of the processing methods and structures may include some active regions formed with one or more v-pits that increase the quantum efficiency of the active region. In embodiments, the v-pits may be formed in active regions characterized by longer peak light emission wavelengths (e.g., red-light-emitting active regions) that have lower quantum efficiencies than active regions characterized by peak light emission at shorter wavelengths. In additional examples, embodiments of the processing methods and structures include forming two or more reflection layers on different active regions characterized by different peak light emission wavelengths. In embodiments, a first reflection layer may be made from a material (e.g., aluminum) that reflects a greater percentage of light from a first active region (e.g., a blue-light-emitting active region), and a second reflection layer may be made from a material (e.g., copper) that reflects a greater percentage of light from a different active region (e.g., a red-light-emitting active region). These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
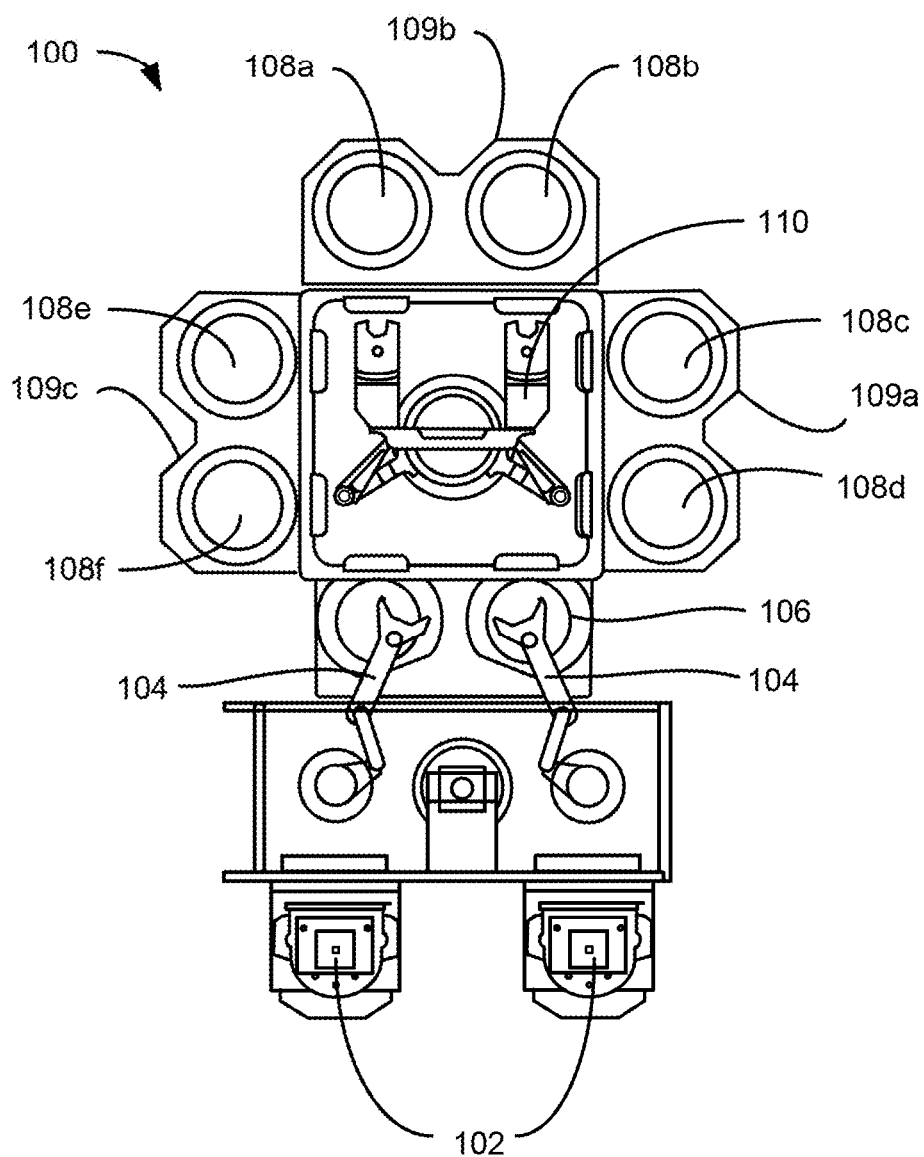
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Nitrides of Group III metals such as aluminum, indium, and gallium are promising materials for making light emitting diodes (LEDs) at micrometer scale (i.e., μLEDs). Unfortunately, the conversion efficiencies for these materials to translate the energy from electrical current into the emission of light is significantly below 100%, and far from uniform across the visible spectrum. Micro-LEDs made from indium-gallium-nitride-containing materials typically have peak quantum efficiencies below 30% across the visible spectrum. Another problem for indium-gallium-and-nitrogen-containing LEDs is that the quantum efficiency is not uniform between active regions tuned to emit light at blue, green, and red wavelengths. The LEDs are significantly more efficient at converting energy from electrical current into blue-colored light than red-colored light. Consequently, a red-green-blue (RGB) pixel made from three subpixels of indium-gallium-and-nitrogen-containing materials use balancing conditions that either increase the intensity of light emission from the red subpixel, decrease the intensity of light emission from the blue subpixel, or both. Additional balancing conditions for the green subpixel, which has a conversion efficiency intermediate between the blue and red subpixels, may also be used.

Many indium-gallium-and-nitrogen-containing active regions of the subpixels produce an isotropic emission of light in all directions. In LED applications, the light the active regions emit toward the substrate normally do not provide useful light. This can result in up to half or more of the photons generated by the active regions of LED subpixels becoming non-usable light, where the already low quantum efficiencies of these subpixels provide few photons to spare. In many cases, a portion of the non-useable light infiltrates into other subpixels in an issue known as subpixel crosstalk. This crosstalk can create a blue hue in a display of InGaN-containing pixels caused by the higher intensity of light emitted by the blue subpixels with higher quantum efficiencies than the green or red subpixels.

Embodiments of the present technology address the problems of low and varied quantum efficiencies in the indium-gallium-and-nitrogen-containing active regions of red, green, and blue, subpixels through a combination of process methods and structures that increase the amount of useful light emitted by the subpixels and reduce the differences in the intensity of light emission from different-colored subpixels. In embodiments, these process methods and structures include the selective porosification of gallium-and-nitrogen containing regions on which intermediate active regions are formed that have an intermediate peak light emission wavelength (e.g., green-light emission) compared to active regions that have both a shorter peak light emission wavelength (e.g., blue-light emission) and a longer peak light emission wavelength (e.g., red-light emission). In further embodiments, the gallium-and-nitrogen-containing regions upon which these intermediate active regions are formed may be the only porosified regions among the different-colored subpixels. Among other benefits, this can reduce the number of porosification operations needed to form the LED.

In further embodiments, the present technology may include the formation of one or more v-pits in the active regions characterized by longer peak light emission wavelengths (e.g., red-light emitting active regions). The v-pits are quantum wells that include a v-shaped portion that provides a more efficient pathway for charge carriers to reach the QWs and convert their energy into a photon-generating event. V-pits can increase the quantum efficiency of red-light emitting active regions without requiring that the underlying structure on which the active region is formed undergo a significant amount of porosification. In embodiments, the v-pit containing active region may be formed on a gallium-and-nitrogen-containing region (or a support layer formed that region) that has no added porosity from a porosification operation. Among other benefits, this permits increases in the quantum efficiency of red-light-emitting active regions without excessive porosification of the underlying gallium-and-nitrogen-containing region. This in turn reduces the failure rate of the active regions caused by defects and delamination of an excessively-porosified underlying support region.

Embodiments of the present technology address the problem of low efficiency in the generation of useful light by incorporating reflective layers into the subpixels of the LED that enhances the useable light extraction and can better meet the performance requirements of a device such as a display or other illuminable device or component. In embodiments, a reflection layer is formed on at least a portion of the subpixel that enhances light emitted from the subpixel in a manner that contributes to the illumination of the device. In further embodiments, at least a portion of the reflection layer may be formed on a surface of a subpixel that faces opposite an optical structure formed on the subpixel through which light passes that illuminates the device. In still further embodiments, the reflection layer increases the amount of useful light extracted from a subpixel's active region by greater than or about 5%, greater than or about 10%, greater than or about 15%, greater than or about 20%, greater than or about 25%, greater than or about 30%, greater than or about 40%, greater than or about 50%, greater than or about 60%, greater than or about 70%, greater than or about 80%, greater than or about 90%, or more, compared to a similar subpixel that lacks the reflection layer.

The present technology also recognizes that the selection of material in the reflection layer may depend on the peak light emission wavelength of the active region proximate to the reflection layer. For example, a reflection material such as copper is more reflective of visible light at longer wavelengths (e.g., red-colored wavelengths) than shorter wavelengths (e.g., green- and blue-colored wavelengths). In embodiments, reflection layers proximate to red-emitting active regions may be made of copper to increase the amount of useful light extracted from red-emitting subpixels. In embodiments, the copper reflection layers can also sharpen the spectrum of the peak light emission from a red-emitting subpixel, and increase the spectrum's peak emission wavelength. In further embodiments, reflection layers made of a metal such as aluminum may be used to extract more useful light from active regions characterized by shorter peak light emission wavelengths such as green and blue light.

FIG. 1 shows a top plan view of one embodiment of a processing system 100 of deposition, etching, baking, and curing chambers according to some embodiments of the present technology. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, anneal, plasma processing, degas, orientation, and other substrate processes.

The substrate processing chambers 108a-f may include one or more system components for depositing, annealing, curing and/or etching a material film on the substrate or wafer. In one configuration, two pairs of the processing chambers, for example 108c-d and 108e-f, may be used to deposit material on the substrate, and the third pair of processing chambers, for example 108a-b, may be used to cure, anneal, or treat the deposited films. In another configuration, all three pairs of chambers, for example 108a-f, may be configured to both deposit and cure a film on the substrate. Any one or more of the processes described may be carried out in additional chambers separated from the fabrication system shown in different embodiments. It will be appreciated that additional configurations of deposition, etching, annealing, and curing chambers for material films are contemplated by system 100. Additionally, any number of other processing systems may be utilized with the present technology, which may incorporate chambers for performing any of the specific operations. In some embodiments, chamber systems which may provide access to multiple processing chambers while maintaining a vacuum environment in various sections, such as the noted holding and transfer areas, may allow operations to be performed in multiple chambers while maintaining a particular vacuum environment between discrete processes.

Figure 2:
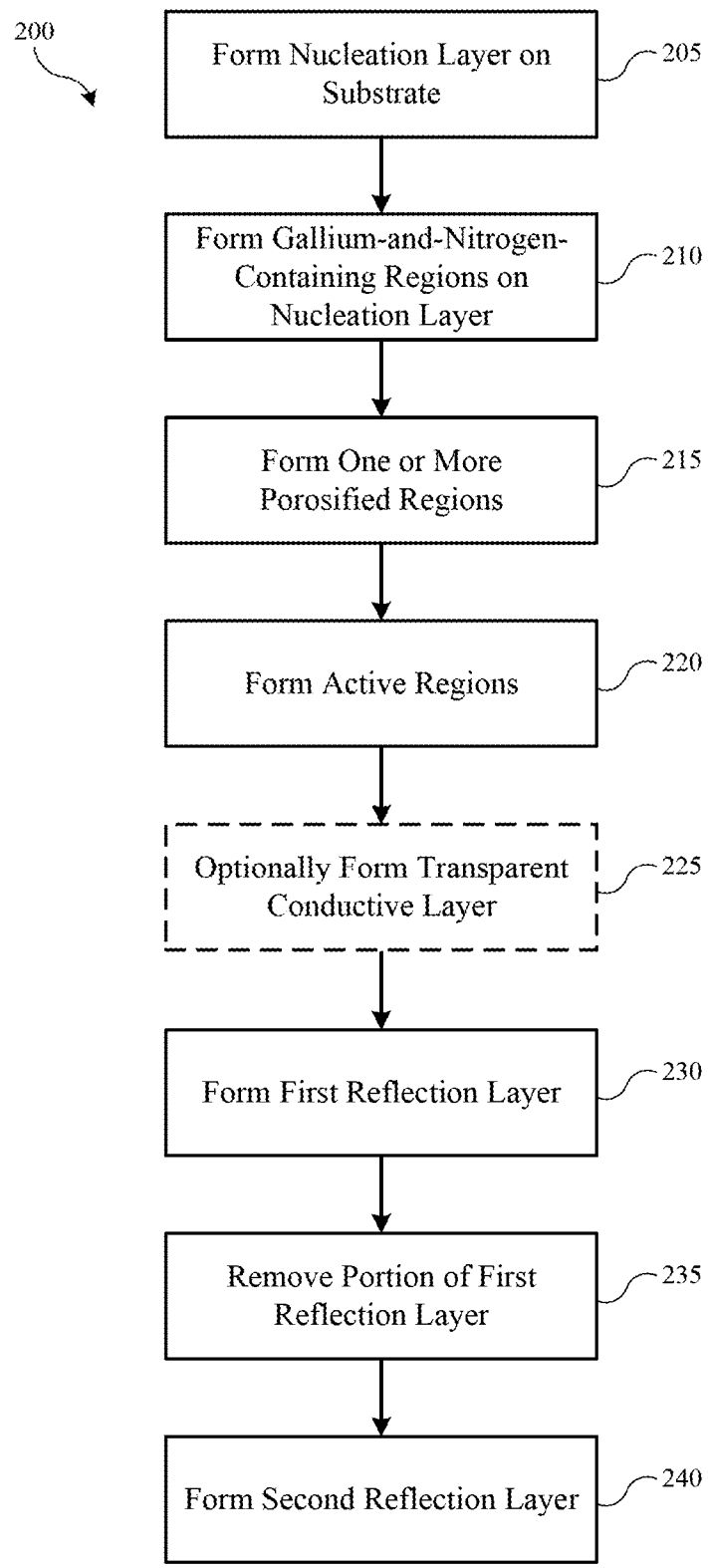
FIG. 2 shows exemplary operations in a method of forming semiconductor devices according to some embodiments of the present technology.

System 100, or more specifically chambers incorporated into system 100 or other processing systems, may be used to produce structures according to some embodiments of the present technology. FIG. 2 shows exemplary operations in a method 200 of forming a semiconductor structure according to some embodiments of the present technology. Method 200 may be performed in one or more processing chambers, such as chambers incorporated in system 100, for example. Method 200 may or may not include one or more operations prior to the initiation of the method, including front-end processing, deposition, etching, polishing, cleaning, or any other operations that may be performed prior to the described operations. The method may include a number of optional operations, which may or may not be specifically associated with some embodiments of methods according to the present technology. Method 200 describes operations shown schematically in FIGS. 3A-3D and FIGS. 4A-D, the illustrations of which will be described in conjunction with the operations of method 200. It is to be understood that FIGS. 3A-3D and FIGS. 4A-D illustrate only partial schematic views with limited details, and in some embodiments a substrate may contain any number of semiconductor sections having aspects as illustrated in the figures, as well as alternative structural aspects that may still benefit from any of the aspects of the present technology.

Figure 3A:
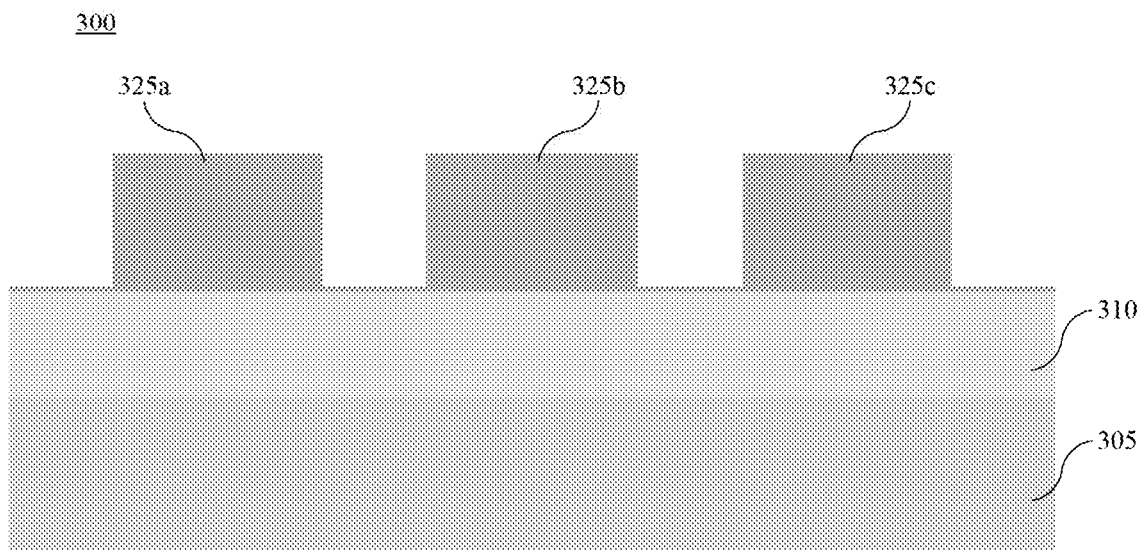
FIGS. 3A-3D show cross-sectional views of semiconductor structures being processed according to embodiments of the present technology.
Figure 3B:
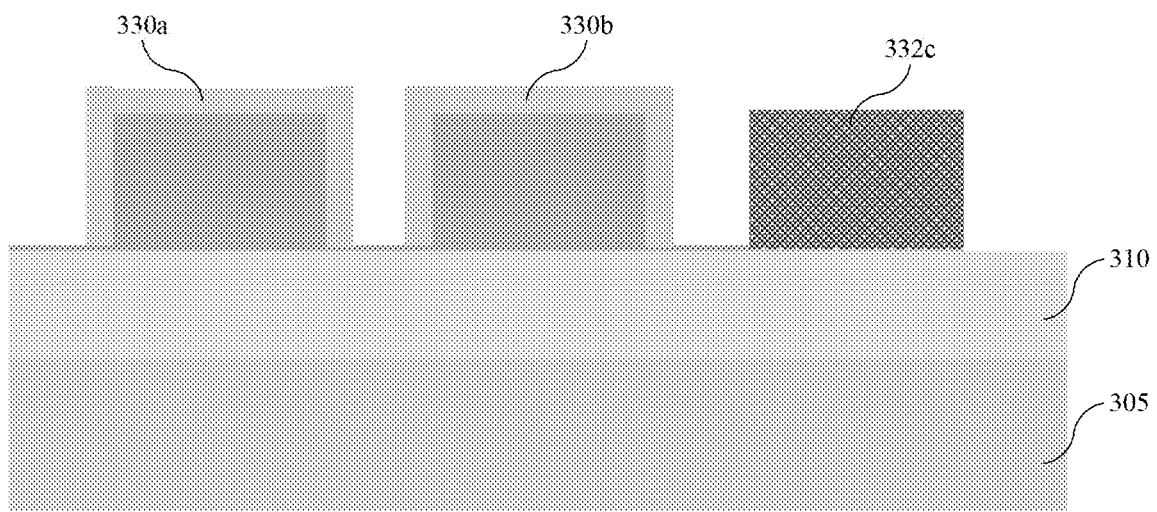

Method 200 may involve operations to develop the semiconductor structure to a particular fabrication operation. Although in some embodiments method 200 may be performed on a base structure, in additional embodiments the method may be performed subsequent other material formation. As illustrated in FIG. 3A, the semiconductor structure may represent a device 300 after front-end or other processing has been completed. For example, substrate 305 may be a planar material, or may be a structured device, which may include multiple materials configured as posts, trenches, or other structures as would be understood are similarly encompassed by the present technology. Substrate 305 may include any number of conductive and/or dielectric materials including metals, including transition metals, post-transition metals, metalloids, oxides, nitrides, and carbides of any of these materials, as well as any other materials that may be incorporated within a structure. In some embodiments, substrate 305 may be or include silicon, which may be doped by any number of materials, as well as silicon-containing or gallium-containing materials. The doping may be n+ or n− in some operations, and the silicon may be formed or grown by any number of techniques. Additionally, in embodiments, one or more doped regions may be included in the substrate. For example any number of n- or p-doping regions may be included on the substrate.

Embodiments of method 200 may include the formation of a nucleation layer 310 on the substrate 305 at operation 205. The nucleation layer provides a surface to form gallium-and-nitrogen-containing regions that would otherwise take too long to form, or not form at all, on the underlying substrate 305. In embodiments, the nucleation layer 310 may include one or more metal nitrides such as aluminum nitride, niobium nitride, titanium nitride, or hafnium nitride, among other types of nitrides. In some embodiments, the nucleation layer may include gallium nitride. In embodiments, the nucleation layer 310 may be formed by physical vapor deposition (PVD) of the nucleation layer on the substrate. In further embodiments, the nucleation layer 310 may be characterized by a thickness greater than or about 5 nm, greater than or about 10 nm, greater than or about 25 nm, greater than or about 50 nm, greater than or about 100 nm, greater than or about 250 nm, greater than or about 500 nm, greater than or about 750 nm, greater than or about 1000 nm, greater than or about 1250 nm, greater than or about 1500 nm, greater than or about 1750 nm, greater than or about 2000 nm, or more.

Method 200 may further include the forming of gallium-and-nitrogen-containing regions 325a-c in operation 210. In embodiments, the gallium-and-nitrogen-containing regions 325a-c may be formed by a top-down process that first deposits a blanket layer of gallium-and-nitrogen-containing material on the nucleation layer 310 before selectively etching gaps in the layer to for the gallium-and-nitrogen-containing regions 325a-c. In further embodiments, the gallium-and-nitrogen-containing regions 325a-c may be formed by a bottom-up process that forms patterned openings in a mask layer deposited on the nucleation layer 310. Gallium-and-nitrogen-containing material is grown on the portions of the nucleation layer 310 that are exposed by the patterned openings in the mask layer.

In embodiments of top-down processes to form the gallium-and-nitrogen-containing regions 325a-c, a blanket layer of gallium-and-nitrogen-containing material may be formed directly on an unpatterned nucleation layer 310. In further embodiments, the blanket layer of gallium-and-nitrogen-containing material may be formed using metal-organic chemical vapor deposition (MOCVD) of gallium-and-nitrogen-containing material on the nucleation layer 310. In yet more embodiments, the MOCVD may include supplying deposition precursors to a deposition region that includes the deposition surface of the nucleation layer 310. In embodiments, the deposition precursors may include one or more alkyl gallium compounds such as trimethylgallium or triethylgallium to provide the gallium component of the gallium-and-nitrogen-containing material that forms the gallium-and-nitrogen-containing layer. In additional embodiments, the deposition precursors may also include ammonia ($NH_3$) to provide the nitrogen component of the gallium-and-nitrogen-containing layer.

In still further embodiments, the gallium-and-nitrogen-containing layer may include one or more additional components such as aluminum and indium. In these embodiments, the deposition precursors may further include one or more organo-aluminum compounds such as trimethyl-aluminum. In additional embodiments, the deposition precursors may further include one or more alkyl indium compounds such as trimethyl indium. In embodiments, the mole ratio of the one or more additional components may be less than or about 15 mol. %, less than or about 12.5 mol. %, less than or about 10 mol. %, less than or about 9 mol. %, less than or about 8 mol. %, less than or about 7 mol. %, less than or about 6 mol. %, less than or about 5 mol. %, or less. For example, the gallium-and-nitrogen-containing layer may include indium at a level less than or about 15 mol. %, less than or about 14 mol. %, less than or about 13 mol. %, less than or about 12 mol. %, less than or about 11 mol. %, less than or about 10 mol. %, less than or about 9 mol. %, less than or about 8 mol. %, less than or about 7 mol. %, less than or about 6 mol. %, less than or about 5 mol. %, less than or about 4 mol. %, less than or about 3 mol. %, less than or about 2 mol. %, less than or about 1 mol. %, or less.

In embodiments, the mole ratio of the nitrogen to the gallium, and other Group III metals, in the gallium-and-nitrogen-containing layer may be adjusted through the flow rate of the nitrogen-containing precursors and the gallium-containing precursors. In further embodiments, the flow rate ratio of the nitrogen-containing precursors to the gallium-containing precursors may be greater than or about 50, greater than or about 100, greater than or about 500, greater than or about 1000, greater than or about 5000, greater than or about 10000, greater than or about 20000, greater than or about 30000, or more.

In additional embodiments, the gallium-and-nitrogen-containing layer may be formed at temperatures selected for the deposition of the precursors on the exposed areas of the nucleation layer 310. In embodiments, the deposition temperature may be characterized as greater than or about 500° C., greater than or about 600° C., greater than or about 700° C., greater than or about 800° C., greater than or about 900° C., greater than or about 1000° C., greater than or about 1100° C., or more. In some embodiments, the deposition temperature for an gallium-and-nitrogen-containing material may adjusted based on the amount of additional components that are present in the material. In embodiments, a gallium-and-nitrogen-containing material that includes a significant amount of indium may be formed at a deposition temperature that is lower than an indium-free gallium-and-nitrogen-containing material. In additional embodiments, a gallium-and-nitrogen-containing material that further includes indium may be deposited at a deposition temperature less than or about 700° C., less than or about 650° C., less than or about 600° C., or less.

In further embodiments, the gallium-and-nitrogen-containing layer may be formed at deposition pressures that facilitate the formation of the regions. In embodiments the gallium-and-nitrogen-containing layer may be formed at deposition pressures greater than or about 10 Torr, greater than or about 50 Torr, greater than or about 100 Torr, greater than or about 200 Torr, greater than or about 300 Torr, greater than or about 400 Torr, greater than or about 500 Torr, greater than or about 600 Torr, greater than or about 700 Torr, or more.

Following the formation of the gallium-and-nitrogen-containing layer, the layer may be etched to form the gallium-and-nitrogen-containing regions 325a-c. In embodiments, the etching process may include a patterned etch that includes the formation and patterning of a mask layer on the blanket gallium-and-nitrogen-containing layer. In further embodiments, gaps are etched into the exposed portions of the gallium-and-nitrogen-containing layer to form the discrete gallium-and-nitrogen-containing regions 325a-c. In still further embodiments, the etching operation may include a dry etch using a gas or plasma-based etchant (e.g., a chlorine-containing etchant such as $Cl_2$, $BCl_3$, and/or $SiCl_4$, among other chlorine-containing etchants). In yet further embodiments, the composition of the etched gallium-and-nitrogen-containing regions 325a-c may be the same as the composition of the pre-etched gallium-and-nitrogen-containing blanket layer. In additional embodiments, the etched sidewalls of the gallium-and-nitrogen-containing regions 325a-c may be passivated with a passivation layer. In still additional embodiments, the passivation layer may comprise an alumina layer ($Al_2O_3$) that is formed by one or more of atomic layer deposition or plasma-enhanced chemical-vapor deposition.

In embodiments, the formation of the gallium-and-nitrogen containing regions 325a-c formed by a top-down process may further include planarizing the regions. In embodiments, the planarizing process may include a chemical-mechanical polishing process. In further embodiments, the planarizing process may include an etching process.

In additional embodiments, the gallium-and-nitrogen-containing regions 325a-c may be formed in a bottom-up process such as a selective area growth (SAG) process. In embodiments, the bottom-up processes may include the formation of a mask layer on the nucleation layer 310. In embodiments, the mask layer may be made from one or more dielectric materials such as silicon oxide, silicon nitride, silicon carbide, amorphous carbon, or silicon-oxy-carbide, among other dielectric materials. The mask layer may be patterned and etched to form openings in the mask layer that permit the growth gallium-and-nitrogen containing materials on the exposed portions of the nucleation layer 310.

In embodiments, the openings in the patterned mask layer permit the formation of the gallium-and-nitrogen-containing regions 325a-c, which constitute elements of three different subpixels (e.g., red-, green-, and blue-light emitting subpixels) that together constitute a pixel in a light-emitting-diode display. A longest dimension of the openings of the patterned mask layer may be less than or about 10 µm less than or about 5 µm, less than or about 1 µm, less than or about 0.9 µm, less than or about 0.8 µm less than or about 0.7 µm less than or about 0.6 µm less than or about 0.5 µm less than or about 0.4 µm less than or about 0.3 µm less than or about 0.2 µm less than or about 0.1 µm or less.

In embodiments, the bottom-up-grown gallium-and-nitrogen-containing regions 325a-c may be formed with a pyramidal shape. In further embodiments, the base of the pyramid may be in contact with the nucleation layer 310, while the apex of the pyramid may point in a direction opposite the nucleation layer.

In further embodiments, the bottom-up grown gallium-and-nitrogen-containing regions 325a-c may be planarized. In embodiments, the planarizing process may include a chemical-mechanical polishing process that is performed after forming a stop layer on the mask layer and the gallium-and-nitrogen-containing regions 325a-c. In further embodiments, the planarizing process may include an etching operation. In embodiments, the apex portion of the gallium-and-nitrogen-containing regions 325a-c may be wet etched or dry etched down to an etch-stop layer. In still further embodiments, the planarizing process may include an annealing process that sublimates off the apex of the pyramidal-shaped region to leave a planar region (sometimes called a c-facet) at the top of the gallium-and-nitrogen-containing regions 325a-c. In embodiments, the planar regions create a stable base for the formation of subsequent components of a subpixel, including a porosified region and an active region.

In embodiments, the annealing process may include heating the gallium-and-nitrogen-containing regions 325a-c in annealing gases for a designated period of time. In further embodiments, the gallium-and-nitrogen-containing regions 325a-c may be annealed at an annealing temperature greater than or about 900° C., greater than or about 1000° C., greater than or about 1100° C., or more. In still further embodiments, the gallium-and-nitrogen-containing regions 325a-c may be annealed in one or more annealing gases that may include at least one of ammonia or hydrogen ($H_2$). In still further embodiments, the gallium-and-nitrogen-containing regions 325a-c may be annealed for less than or about 10 minutes, less than or about 7.5 minutes, less than or about 5 minutes, or less.

Method 200 may also include forming one or more porosified regions of the subpixels in operation 215. In embodiments, the porosified regions may be formed by exposing one or more of the gallium-and-nitrogen-containing regions 325a-c to a porosification process. In the embodiment shown in FIG. 3B, the gallium-and-nitrogen-containing region 325c is exposed to a porosification process, while gallium-and-nitrogen-containing regions 325a-b are shielded from the porosification process by the deposition of shielding layers 330a-b. In further embodiments, the shielding layers 330a-b may be dielectric layers (e.g., silicon oxide, silicon nitride) formed on the gallium-and-nitrogen-containing regions 325a-b.

In embodiments, the gallium-and-nitrogen-containing region 325c may be porosified by exposing by the region to porosity etchants that etch porosity dopants that where incorporated into the region during its formation (e.g., during the formation of the gallium-and-nitrogen-containing blanket layer or during the bottom-up growth of the gallium-and-nitrogen-containing regions 325a-c). The porosity dopants may increase a rate which porosity etchants can form pores in the doped regions. The porosity dopant level may be used to adjust the amount of porosity formed in the doped regions. In additional embodiments, the porosity dopants may include silicon (Si) incorporated into the gallium-and-nitrogen-containing region 325c. In embodiments, the amount of incorporated silicon may be greater than or about $5 \times 10^{17}$ atoms/cm³, greater than or about $1 \times 10^{18}$ atoms/cm³, greater than or about $2 \times 10^{18}$ atoms/cm³, greater than or about $3 \times 10^{18}$ atoms/cm³, greater than or about $4 \times 10^{18}$ atoms/cm³, greater than or about $5 \times 10^{18}$ atoms/cm³, greater than or about $6 \times 10^{18}$ atoms/cm³, greater than or about $7 \times 10^{18}$ atoms/cm³, greater than or about $8 \times 10^{18}$ atoms/cm³, greater than or about $9 \times 10^{18}$ atoms/cm³, greater than or about $1 \times 10^{19}$ atoms/cm³, or more.

In embodiments of the porosification operation 215, an electrochemical etch process may be used to expose at least a portion of the porosity dopants in the exposed gallium-and-nitrogen-containing region 325c to an electrochemical etchant while a voltage is applied to the region. In additional embodiments, the electrochemical etchant may be an acid such as oxalic acid or sulfuric acid. In further embodiments, the electrochemical etchant may be a base such as potassium hydroxide. In further embodiments, the voltage applied to the exposed gallium-and-nitrogen-containing region 325c may be greater than or about 1 volt, greater than or about 5 volts, greater than or about 10 volts, greater than or about 12.5 volts, greater than or about 15 volts, greater than or about 17.5 volts, greater than or about 20 volts, greater than or about 22.5 volts, greater than or about 25 volts, greater than or about 27.5 volts, greater than or about 30 volts, or more.

In embodiments, the porosification operation 215 may increase the void fraction a porosified region 332c. In further embodiments, the increased porosity of the porosified region 332c may permit the formation of an active region characterized by a peak light emission wavelength that is longer than a second active region formed from the same active layer material that is deposited on a gallium-and-nitrogen containing region with less or no added porosity (e.g., gallium-and-nitrogen-containing region 325b). This permits two active regions emitting different-colored light (e.g., blue and green light) to be formed from the deposition of one active layer material on the unporosified and porosified gallium-and-nitrogen containing regions (e.g., unporosfied region 325b and porosified region 332c). In yet further embodiments, the porosified region 332c may have a more compliant lattice structure that causes fewer defects and less stress in a subsequently-deposited active region. In embodiments, this may significantly increase the quantum efficiency of the active region to convert the energy of electrical current into light.

In additional embodiments (not show in FIGS. 3A-D), a porosification region may be formed on the gallium-and-nitrogen-containing region 325c instead of (or in addition to) porosifying the gallium-and-nitrogen-containing region 325c. In these embodiments, the independent porosification region may be formed from a pre-porosified layer deposited on the gallium-and-nitrogen-containing region 325c. In embodiments, the pre-porosified layer may include gallium and nitrogen. In still further embodiments, the pre-porosified layer may include indium in addition to the gallium and the nitrogen. In yet additional embodiments, the pre-porosified layer may have the same mole percentages of gallium and nitrogen as the gallium-and-nitrogen-containing region 325c. In still additional embodiments, the pre-porosified layer may have the same mole percentages of indium, gallium, and nitrogen, as the gallium-and-nitrogen-containing region 325c. In yet still further embodiments, the pre-porosified layer may be characterized by the same chemical compositions as the gallium-and-nitrogen-containing region 325c, but be characterized by a greater density.

In additional embodiments, two or more of the gallium-and-nitrogen-containing regions 325a-c may include some added porosity or may include an independently formed porosification region. In these embodiments, different levels of porosity may be added to different regions by adjusting of one or more porosification parameters for different regions to provide different levels of added porosity. In further embodiments, one or more porosification parameters such as the doping level of a porosity dopant in each doped region, the electrochemical etching voltage applied to each doped region, and the selective masking of doped regions may be used to vary the amount of added porosity for different porosified regions.

In embodiments, the formation of the porosified region 332c, and other porosified regions, may be done before the deposition of the active regions. This permits the active regions to avoid some of the damage and contamination that may occur during porosification and further increase quantum efficiency for the device 300.

Figure 3C:
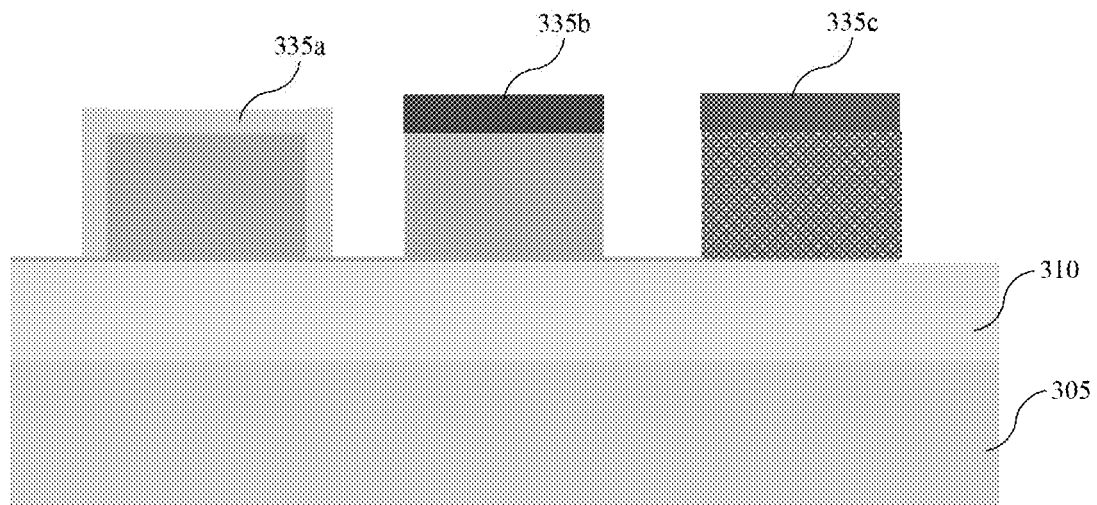
Figure 3D:
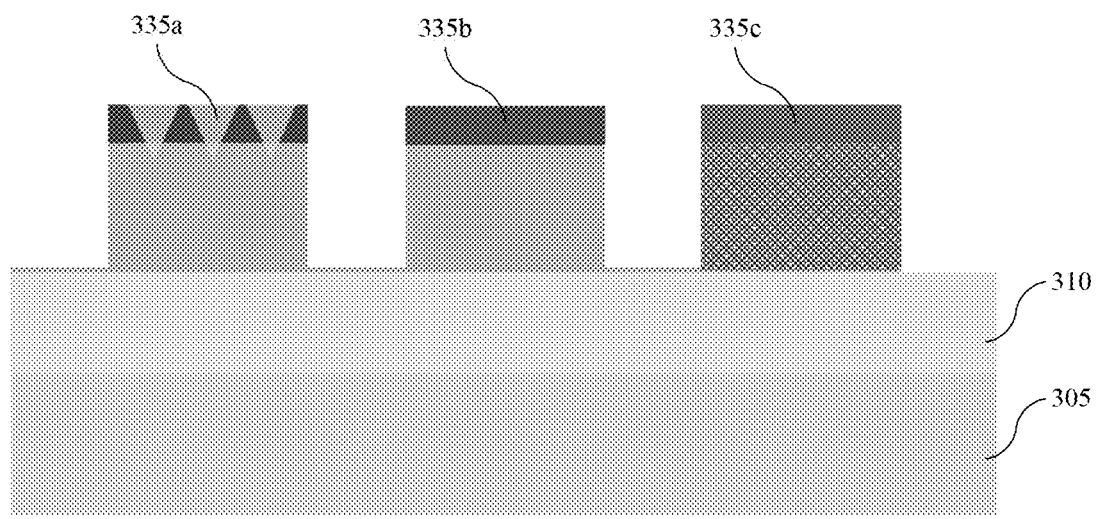

Method 200 may still further include an operation 220 to form the active regions of the subpixels that convert energy from a supplied electrical current into light. As illustrated in FIG. 3C, the active regions 335b-c may be formed on porosified region 332c and unporosified gallium-and-nitrogen-containing region 325c, respectively. In embodiments, the active regions 335b-c may be made from an InGaN-containing material deposited in the a single operation on both the porosified region 332c and unporosified gallium-and-nitrogen-containing region 325c. In further embodiments, this single deposition forms a blue-light-emitting active region 335b and a green-light-emitting active region 335c. In embodiments, the active regions 335b and 335c may be characterized by different densities and different molar percentages of indium despite being formed from the same as-deposited InGaN-containing active-region material. While not wishing to be bound to any particular theory, it is believed that the different levels of porosity in the porosified region 332c and unporosified gallium-and-nitrogen-containing region 325c create different crystallization conditions for the active regions 335b-c that give them different densities and molar percentages of indium, among other characteristics.

In embodiments, the active region 335b formed on unporosified gallium-and-nitrogen-containing region 325c may include a mole percentage of indium that is less than or about 15 mol. %, less than or about 14 mol. %, less than or about 13 mol. %, less than or about 12 mol. %, less than or about 11 mol. %, less than or about 10 mol. %, or less. This blue-emitting active region 335b may produce light characterized by a peak intensity wavelength of less than or about 500 nm, less than or about 490 nm, less than or about 480 nm, less than or about 470 nm, less than or about 460 nm, less than or about 450 nm, less than or about 440 nm, less than or about 430 nm, less than or about 420 nm, less than or about 410 nm, less than or about 400 nm, or less. In further embodiments, the active region 335c formed on porosified region 332c may have a mole percentage of indium that is greater than or about 20 mol. %, greater than or about 21 mol. %, greater than or about 22 mol. %, greater than or about 23 mol. %, greater than or about 24 mol. %, greater than or about 25 mol. %, greater than or about 26 mol. %, greater than or about 27 mol. %, greater than or about 28 mol. %, greater than or about 29 mol. %, greater than or about 30 mol. %, or more. This red-emitting active region 345c may produce light characterized by a peak intensity wavelength of greater than or about 520 nm, greater than or about 530 nm, greater than or about 540 nm, greater than or about 550 nm, greater than or about 560 nm, greater than or about 570 nm, greater than or about 580 nm, greater than or about 590 nm, greater than or about 600 nm, greater than or about 610 nm, greater than or about 620 nm, or more. In yet further embodiments, the active region 335c may have an intermediate mole percentage of indium that is greater than the mole percentage indium in active region 335b and less than the mole percentage indium in the active region 335a. In further embodiments, the active region 335c may be characterized by a mole percentage of indium that is greater than or about 20 mol. %, and less than or about 25 mol. %. This green-emitting active region 335c may produce light characterized by a peak intensity wavelength greater than the peak intensity wavelength produced by active region 335b and less than the peak intensity wavelength produced by active region 335a. In embodiments, active region 335c may be characterized by the emission of light having a peak intensity wavelength about 530 nm.

Figure 4A:
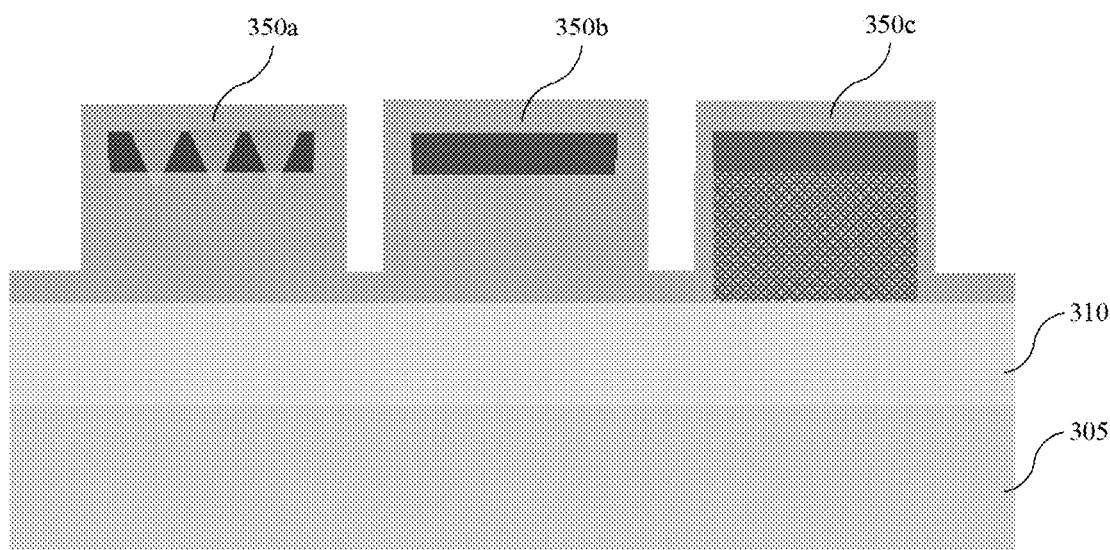
FIGS. 4A-D show additional cross-sectional views of semiconductor structures being processed according to embodiments of the present technology.
Figure 4B:
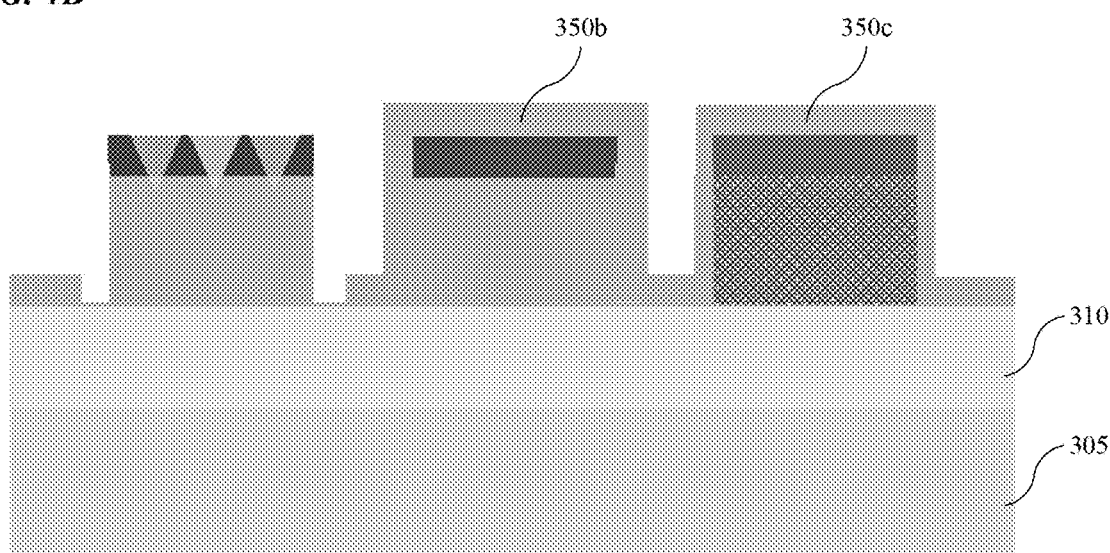
Figure 4C:
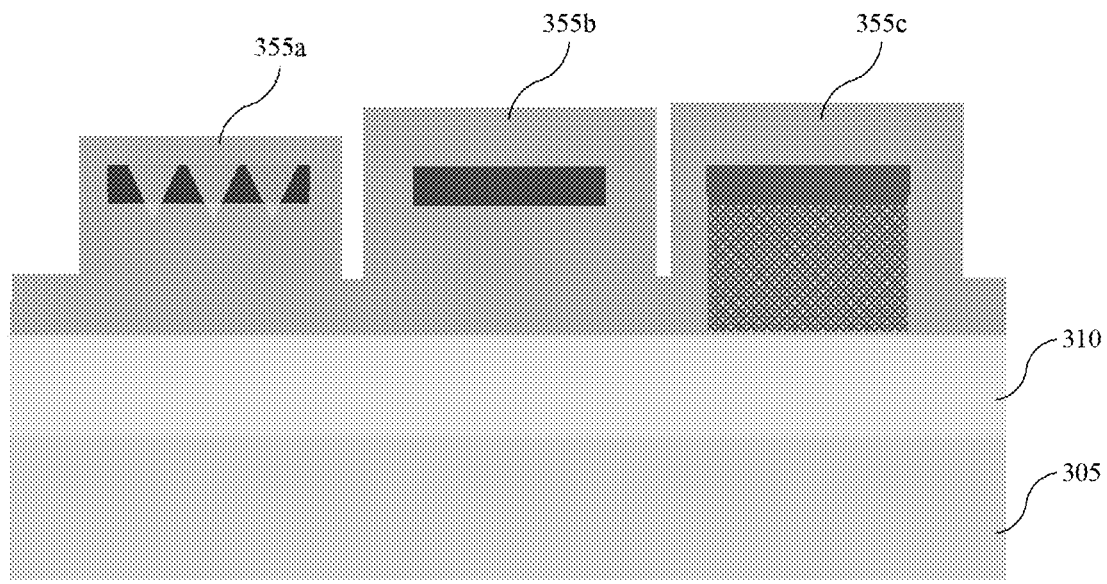
Figure 4D:
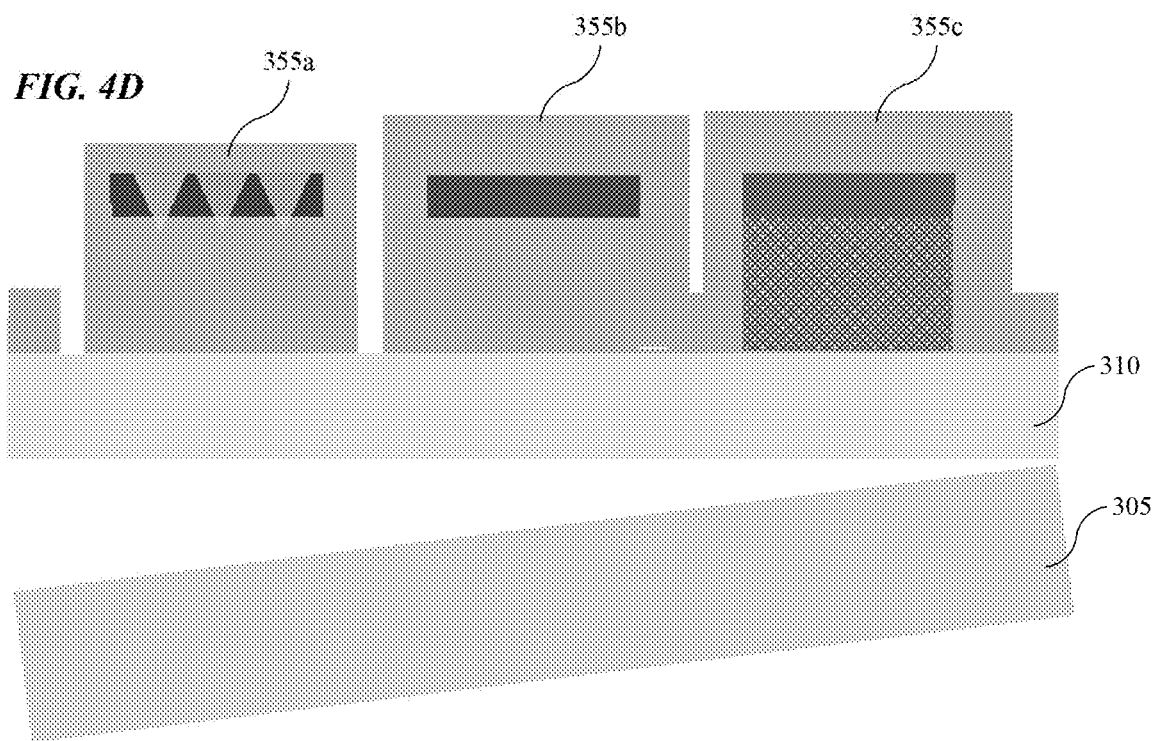

Referring now to FIG. 4D, embodiments of operation 220 in method 200 may further include the formation of active region 335a characterized by a peak light emission wavelength that is greater than the peak light emission wavelengths of active regions 335b-c. In embodiments, the active region 335a may be formed on unporosified gallium-and-nitrogen-containing region 325a. In further embodiments, active region 335a may include one or more v-pits that permit the active region 335a to be characterized by a longer peak light emission wavelength despite being formed on an unporosified gallium-and-nitrogen-containing region 325a. In yet further embodiments, the active region 335a may be characterized by a peak light emission wavelength greater than or about greater than or about 600 nm, greater than or about 610 nm, greater than or about 620 nm, greater than or about 630 nm, greater than or about 640 nm, greater than or about 650 nm, greater than or about 660 nm, greater than or about 670 nm, greater than or about 680 nm, greater than or about 690 nm, greater than or about 700 nm, or more.

In embodiments, the formation of the one or more v-pits in active region 335a may include the formation of one or more quantum well layers on the gallium-and-nitrogen-containing region 325a. In additional embodiments, the quantum wells may be formed on one more layers of an InGaN-containing material deposited on the gallium-and-nitrogen-containing region 325a that may be collectively referred to as a InGaN/GaN-superlattice (SL). In embodiments, the number of quantum well layers formed on the gallium-and-nitrogen-containing region 325a, or the InGaN/GaN-superlattice, may be greater than or about 2 quantum well layers, greater than or about 3 quantum well layers, greater than or about 4 quantum well layers, greater than or about 5 quantum well layers, greater than or about 6 quantum well layers, greater than or about 7 quantum well layers, greater than or about 8 quantum well layers, greater than or about 9 quantum well layers, greater than or about 10 quantum well layers, or more. In still further embodiments, the quantum well layers may include indium, gallium, and nitrogen (e.g., InGaN). In yet further embodiments, the quantum well layers may be characterized by a thickness greater than or about 1 nm, greater than or about 2 nm, greater than or about 3 nm, greater than or about 4 nm, greater than or about 5 nm, or more.

In additional embodiments, the quantum well layers may be grown under conditions that produce one or more pits in the quantum well layers. In further embodiments, the pits may be characterized by a hexagonal shape with an inverted apex pointed towards the gallium-and-nitrogen-containing region 325a, or the InGaN/GaN-superlattice. In yet further embodiments, a cross-section of the hexagonal pit aligned with the apex and orthogonal to the planes of the quantum well layers shows a v-shaped indentation in the quantum well layers that give the v-pits their name. In further embodiments, the number density of the v-pits formed in the quantum well layers may be characterized as greater than or about $5 \times 10^7$ cm$^{-2}$, greater than or about $1 \times 10^8$ cm$^{-2}$, greater than or about $1.1 \times 10^8$ cm$^{-2}$, greater than or about $1.2 \times 10^8$ cm$^{-2}$, greater than or about $1.3 \times 10^8$ cm$^{-2}$, greater than or about $1.4 \times 10^8$ cm$^{-2}$, greater than or about $1.5 \times 10^8$ cm$^{-2}$, greater than or about $1.6 \times 10^8$ cm$^{-2}$, greater than or about $1.7 \times 10^8$ cm$^{-2}$, greater than or about $1.8 \times 10^8$ cm$^{-2}$, greater than or about $1.9 \times 10^8$ cm$^{-2}$, greater than or about $2 \times 10^8$ cm$^{-2}$, or more.

In still further embodiments, one or more additional layers may be formed on the quantum well layers. These additional layers may include one or more p-doped aluminum-gallium-and-nitrogen-containing layers, and one or more p-doped gallium-and-nitrogen-containing layer that may complement the gallium-and-nitrogen-containing region 325a that is n-doped.

In embodiments, the v-pit-containing active layer 335a may have an external quantum efficiency that is significantly greater than a conventional red-light-emitting active layer formed on a highly porosified gallium-and-nitrogen-containing region. In further embodiments the v-pit-containing active layer 335a may have an external quantum efficiency that is greater than or about 0.1%, greater than or about 0.2%, greater than or about 0.3%, greater than or about 0.4%, greater than or about 0.5%, greater than or about 0.6%, greater than or about 0.7%, greater than or about 0.8%, greater than or about 0.9%, greater than or about 1%, greater than or about 5%, greater than or about 10%, greater than or about 20%, greater than or about 30%, greater than or about 40%, greater than or about 50%, greater than or about 60%, or more.

The method 200 may still further include optionally forming one or more pre-reflection layers on the active regions 335a-c at operation 225. In embodiments, these pre-reflection layers may include a transparent conductive layer that creates an ohmic contact between the active regions and the gallium-and-nitrogen-containing regions, while also permitting light emitted from the active regions to pass to and from the reflection layers. In further embodiments, the pre-reflection layers may include a barrier layer that prevents in the diffusion of metal species from the reflection layers into the active layers. In yet further embodiments, the pre-reflection layers may include a transparent layer that can act as both an electrically conductive, ohmic contact layer and a barrier layer to metal diffusion. In still further embodiments, the pre-reflection layer may include a transparent conductive oxide. In additional embodiments, the transparent conductive oxide may include indium-tin-oxide. In still additional embodiments, the barrier layer may be made of materials that permit the passage of light between the active regions 335a-c and the reflection layer. In further embodiments, the barrier layer may be made from at least one of titanium nitride and tantalum nitride. In more embodiments, the barrier layer may have a thickness that permits the passage of light between the active regions 335a-c and the reflection layer. In embodiments, the barrier layer may be characterized by a thickness less than or about 5 nm, less than or about 2.5 nm, less than or about 2 nm, less than or about 1.5 nm, less than or about 1 nm, or less.

The method 200 may yet further include operations 230-240 to form reflection layers 350 and 355 over the active regions 335a-c and other components of the subpixels, as shown in FIGS. 4A-D. A shown in FIG. 4A, a device embodiment is illustrated where a useful light emitted from the active regions 335a-c may be in the direction of the nucleation layer 310 and the substrate 305. In these embodiments, the operation 230 to form first reflection layer 350 may include a single formation operation to form the first reflection layer 350, including the portions of the reflection layer 350a-c formed on active regions 335a-c, and any pre-reflection layers formed on the active regions. In embodiments, the first reflection layer 350 may include aluminum, or another metal that reflects across the visible spectrum at approximately the same efficiency. In further embodiments, the first reflection layer 350 may be formed using physical vapor deposition, atomic layer deposition, thermal evaporation, e-beam evaporation, electroless plating, and electroplating, among other formation methods. The reflection layer 350 may be formed with thicknesses of less than or about 2000 nm, less than or about 1500 nm, less than or about 1000 nm, less than or about 500 nm, less than or about 250 nm, less than or about 100 nm, less than or about 50 nm, less than or about 25 nm, less than or about 20 nm, less than or about 15 nm, less than or about 10 nm, or less.

The method 200 may further include removing a portion of the first reflection layer 350 at operation 235. As shown in FIG. 4B, the removed portion of the first reflection layer 350 may include the portion in proximity to active region 335a (i.e., first reflection layer portion 350a). In further embodiments, the removal of the portion of reflection layer 350a may include a patterned etching the layer 350a while shielding the other portions of the reflection layer 350b-c.

The method 200 may still further include the formation of a second reflection layer 355 at operation 240. As shown in FIG. 4C, the second reflection layer may include portions 355b-c formed on the unremoved portions of the first reflection layer 350b-c, and a portion formed proximate to active layer 335a where a portion of the first reflection layer 350a has been removed. The formation-removal-formation operations 230-240 for the formation of the reflection layers 350 and 355 consolidates the formation of three portions of reflection layers (i.e., first reflection layer 350b-c and second refection layers 355a) in two formation steps.

As shown in FIG. 4D, the formation operations may still further include the removal of substrate layer 305 to leave the nucleation layer 310 supporting the subpixels and passing useful light from them. In embodiments, the substrate layer 305 may be removed by grinding down the backside of a wafer upon which the substrate layer 305 is formed. In further embodiments, the substrate layer 305 may be removed by chemical etching, such as wet etching (e.g., etching in aqueous KOH), or dry etching (e.g., etching with $SF_6$). In yet further embodiments, the substrate layer 305 may be removed by a bulk removal process followed by chemical mechanical planarization of the remaining substrate layer. In additional embodiments, the substrate layer 305 (e.g., a sapphire-containing or glass-containing substrate layer) may be removed by laser lift-off.

The present technology recognizes that reflection layers made of aluminum are more efficient at reflecting shorter wavelengths of visible light, such as blue and green light, than red light. It also recognizes that reflection layers made of copper are more efficient at reflecting red light than blue and green light. In embodiments, the portions of the first reflections layer 350b and 350c may have a reflection efficiency of greater than or about 50%, greater than or about 60%, greater than or about 70%, greater than or about 80%, greater than or about 90%, greater than or about 95%, greater than or about 99%, or more, for reflecting light having wavelengths of less than or about 600 nm. In further embodiments, the second reflection layer 350a may have a reflection efficiency of greater than or about 50%, greater than or about 60%, greater than or about 70%, greater than or about 80%, greater than or about 90%, greater than or about 95%, greater than or about 99%, or more, for reflecting light having wavelengths of greater than 600 nm, greater than or about 610 nm, greater than or about 620 nm, or more. In embodiments, the second reflection layer 355a proximate to red-emitting active region 335a may be made of copper to increase the amount of useful light extracted from red-emitting subpixels. In embodiments, the copper-containing, second reflection layer 355a can also sharpen the spectrum of the peak light emission from a red-emitting subpixel, and increase the spectrum's peak emission wavelength.

In embodiments, the portions of reflection layers 350b-c and 355a extract more useful light from the active regions 335a-c. In further embodiments, the reflection layers may increase the intensity of useful light from a subpixel by greater than or about 5%, greater than or about 10%, greater than or about 15%, greater than or about 20%, greater than or about 25%, or more, compared to a similar subpixel that lacks the reflection layer.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a trench" includes a plurality of such trenches, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:
1. A semiconductor processing method comprising:
  forming a nucleation layer on a semiconductor substrate;
  forming first, second, and third gallium-and-nitrogen-containing regions on the nucleation layer;

porosifying the first gallium-and-nitrogen-containing region, without porosifiying the second and third gallium-and-nitrogen-containing regions;

forming a first active region on the porosified first gallium-and-nitrogen-containing region, and a second active region on the unporosified second gallium-and-nitrogen-containing region; and forming a third active region on the unporosified third gallium-and-nitrogen-containing region.

2. The semiconductor processing method of claim 1, wherein the first active region and the second active region are formed in a single deposition of an active region material on the semiconductor substrate.

3. The semiconductor processing method of claim 2, wherein the active region material comprises an InGaN-containing material.

4. The semiconductor processing method of claim 1, wherein the forming of the third active region further comprises forming one or more v-pits in the third active region.

5. The semiconductor processing method of claim 1, wherein:
the first active region is characterized by a first peak light emission wavelength between a second peak light emission wavelength that characterizes the second active region and a third peak light emission wavelength that characterizes the third active region, and
the second peak light emission wavelength is less than or about 550 nm, and
the third peak light emission wavelength is greater than or about 600 nm.

6. The semiconductor processing method of claim 1, wherein the method further comprises:
forming a first reflection layer on the first, second, and third active regions;
removing a portion of the first reflection layer from the third active region; and
forming a second reflection layer over the first, second, and third active regions.

7. The semiconductor processing method of claim 6, wherein the first reflection layer comprises aluminum and the second reflection layer comprises copper.

8. A semiconductor processing method comprising:
forming first, second, and third gallium-and-nitrogen-containing regions;
depositing an active region material on the first and second gallium-and-nitrogen-containing-regions, wherein the active region material is formed into a first active region on the first gallium-and-nitrogen-containing region, and a second active region on the second gallium-and-nitrogen-containing region;
forming a third active region on the third gallium-and-nitrogen-containing region;
forming a first reflection layer on the first, second, and third active regions;
removing a portion of the first reflection layer from the third active region; and
forming a second reflection layer over the first, second, and third active regions.

9. The semiconductor processing method of claim 8, wherein the method further comprises forming a transparent conductive layer on the first, second, and third active regions before the forming of the first reflection layer on the first, second, and third active regions.

10. The semiconductor processing method of claim 8, wherein the transparent conductive layer comprises indium-tin-oxide.

11. The semiconductor processing method of claim 8, wherein the first reflection layer comprises aluminum, and the second reflection layer comprises copper.

12. The semiconductor processing method of claim 8, wherein the method further comprises porosifying the first gallium-and-nitrogen-containing region without porosifiying the second and third gallium-and-nitrogen-containing regions.

13. The semiconductor processing method of claim 8, wherein the forming of the third active region further comprises forming one or more v-pits in the third active region.

14. The semiconductor processing method of claim 8, wherein:
the first active region is characterized by a first peak light emission wavelength between a second peak light emission wavelength that characterizes the second active region and a third peak light emission wavelength that characterizes the third active region, and
the second peak light emission wavelength is less than or about 550 nm, and
the third peak light emission wavelength is greater than or about 600 nm.

15. A semiconductor structure comprising:
a first InGaN-containing active region on a porosified first gallium-and-nitrogen-containing region;
a second InGaN-containing active region on an unporosified second gallium-and-nitrogen-containing region; and
a third InGaN-containing active region on an unporosified third gallium-and-nitrogen-containing layer,
wherein the first active region is characterized by a first peak light emission wavelength between a second peak light emission wavelength that characterizes the second active region and a third peak light emission wavelength that characterizes the third active region, and
the second peak light emission wavelength is less than or about 550 nm, and
the third peak light emission wavelength is greater than or about 600 nm.

16. The semiconductor structure of claim 15, wherein the first, second, and third, gallium-and-nitrogen-containing regions contact a nucleation layer comprising aluminum nitride, niobium nitride, titanium nitride, or hafnium nitride.

17. The semiconductor structure of claim 15, wherein the first InGaN-containing active region and the second InGaN-containing active region are formed from a single deposition of InGaN-containing material.

18. The semiconductor structure of claim 15, wherein the third InGaN-containing active region comprises one or more v-pits.

19. The semiconductor structure of claim 15, wherein the semiconductor structure further comprises a first reflection layer comprising aluminum on the first and second active regions, and a second reflection layer comprising copper on the third active region.

20. The semiconductor structure of claim 19, wherein the semiconductor structure further comprises a transparent conductive layer positioned between the active regions and the reflection layers.

* * * * *